(12) United States Patent  (10) Patent No.: US 8,081,422 B2
Shannon et al.  (45) Date of Patent: Dec. 20, 2011

(54) POWER DISTRIBUTION SYSTEM

(75) Inventors: Paul Shannon, Parsippany, NJ (US);
Mahesh Mistry, Parsippany, NJ (US)

(73) Assignee: Fujitsu Limited, Kawasaki (JP)

( * ) Notice: Subject to any disclaimer, the term of this patent is extended or adjusted under 35 U.S.C. 154(b) by 61 days.

(21) Appl. No.: 12/418,676

(22) Filed: Apr. 6, 2009

(65) Prior Publication Data

US 2010/0085687 A1   Apr. 8, 2010

Related U.S. Application Data

(60) Provisional application No. 61/102,039, filed on Oct. 2, 2008.

(51) Int. Cl.
*H02B 1/26* (2006.01)

(52) U.S. Cl. ........ 361/624; 361/637; 361/648; 361/729; 439/76.2; 307/43

(58) Field of Classification Search ............... 361/634, 361/644, 652, 673, 679.01, 728, 752, 788, 361/796, 800, 622, 624, 629, 637, 641
See application file for complete search history.

(56) References Cited

U.S. PATENT DOCUMENTS

| | | | | |
|---|---|---|---|---|
| 5,737,194 | A * | 4/1998 | Hopkins et al. | 361/800 |
| 6,693,371 | B2 * | 2/2004 | Ziegler et al. | 307/64 |
| 6,796,808 | B2 * | 9/2004 | Hosoe et al. | 439/76.2 |
| 7,154,761 | B1 * | 12/2006 | Camerlo et al. | 361/788 |
| 7,324,335 | B2 * | 1/2008 | Sueyoshi | 361/679.33 |
| 2006/0040563 | A1 * | 2/2006 | Fuller et al. | 439/668 |
| 2006/0171133 | A1 * | 8/2006 | Pedoeem et al. | 361/796 |

* cited by examiner

*Primary Examiner* — Courtney Smith

(74) *Attorney, Agent, or Firm* — Baker Botts L.L.P.

(57) ABSTRACT

A back-wiring board that connects to a main circuit board of a power distribution system. The back-wiring board includes a plurality of connectors configured to mechanically secure to a plurality of bus bars. The connectors of the back-wiring board are further configured to receive a voltage signal from the plurality of bus bars and to transmit the voltage signal to the back-wiring board. The back-wiring board also includes a plurality of wire-wrap pins integrated into a surface of the back-wiring board, wherein the wire-wrap pins are configured to receive data input signals. The back-wiring board includes a right-angle connector configured to couple the back-wiring board to the main circuit board.

16 Claims, 5 Drawing Sheets

POWER DISTRIBUTION SYSTEM

RELATED APPLICATION

This application claims the benefit under 35 U.S.C. §119 (e) of U.S. Provisional Application No. 61/102,039 filed Oct. 2, 2008, entitled "System and Method for Connecting Power Distribution Unit".

TECHNICAL FIELD

This invention relates generally to a power distribution system, and more particularly to a back-wiring board configured to minimize wiring within the power distribution system.

BACKGROUND

Telecommunications networks use a plurality of network nodes and communication channels to rapidly communicate large amounts of data through the network. The nodes of a telecommunication network may be configured to send, receive, and forward data over the communication channels of the network. Certain nodes within the network may be powered by a power distribution system. Such power distribution systems are designed to deliver power to the telecommunications equipment through a series of electrical circuits. A power distribution system, such as a circuit breaker panel, is designed to deliver power and to protect the electrical circuits from damage potentially caused by equipment overheating, a short circuit, or an overloaded circuit. Circuit breaker panels may be configured into various sizes, depending on the type and size of equipment being powered.

Circuit breaker panels typically include a plurality of contacts or conductors, such as feeder bus bars, in order to carry a load current. The bus bars are typically made of copper, aluminum, or a metal-alloy composition. Bus bars are typically either flat strips or hollow tubes, as these configurations typically allow for more efficient heat dissipation while safely carrying the maximum amount of current.

Circuit breaker panels, typically include a main printed circuit board (PCB) that is configured to detect input voltage levels from the feeder and return bus bars and sense other externally-fed input signals. The main PCB is typically hard-wired to each bus bar and each signal input. For example, the PCB may be wired to each bus bar via a cable assembly, which comprises a series of individual wires that are manually connected between the main PCB and the bus bars. Also, in the case of sensing externally-fed input signals, the main PCB may also be manually wired to a wire wrap block via a cable assembly. Each of the individual wires of the cable assembly are wrapped to each pin of the wire wrap block. However, the process of manually wiring the bus bars and wire wrap block to the main PCB can be time and cost intensive, in addition to providing an increased possibility for mis-wiring within the power distribution unit. Therefore, there is a need for a system and method for determining the system voltage levels of the bus bars and for sensing other input signals, without the use of manually wired cable assemblies in the power, within the power distribution system.

SUMMARY

In one embodiment, a power distribution unit is provided. The power distribution unit includes a plurality of bus bars for conducting electricity within the power distribution unit. The power distribution unit further includes a first circuit board for controlling the operation of the power distribution unit and a second circuit board coupled to the first circuit board, wherein the second circuit board is configured to connect each of the plurality of bus bars to the first circuit board, such that the second circuit board is configured to receive a voltage signal from each of the plurality of bus bars and transmit the voltage signals to the first circuit board. The power distribution unit also includes a plurality of wire-wrap pins integrated into a surface of the second circuit board, wherein the wire-wrap pins are configured to receive data input signals and to transmit the data input signals to the first circuit board via the second circuit board.

In another embodiment, a power distribution system having a main circuit board configured to control the operation of the power distribution system is provided. The power distribution system includes a primary circuit board configured to control the operation of the power distribution system and a plurality of bus bars for conducting electricity within the power distribution system. The power distribution system further includes a back-wiring board coupled to the primary circuit board, the back wiring board being further configured to be coupled with the plurality of bus bars, wherein the back-wiring board is configured to receive a voltage signal from each of the plurality of bus bars. The back-wiring board is configured to include a plurality of wire-wrap pins, such that the wire-wrap pins are integrated into a surface of the back-wiring board, wherein the wire-wrap pins are configured to receive data input signals.

In yet another embodiment, a back-wiring board is provided. The back-wiring board includes a plurality of connectors configured to secure a plurality of bus bars to the back-wiring board, such that the back-wiring board is configured to receive a voltage signal from the plurality of feeder bus bars. The back-wiring board further includes a plurality of wire-wrap pins integrated into a surface of the back-wiring board, wherein the wire-wrap pins are configured to receive data input signals, and a right angle connector configured to couple the back-wiring board to a second circuit board.

DETAILED DESCRIPTION

Figure 1:
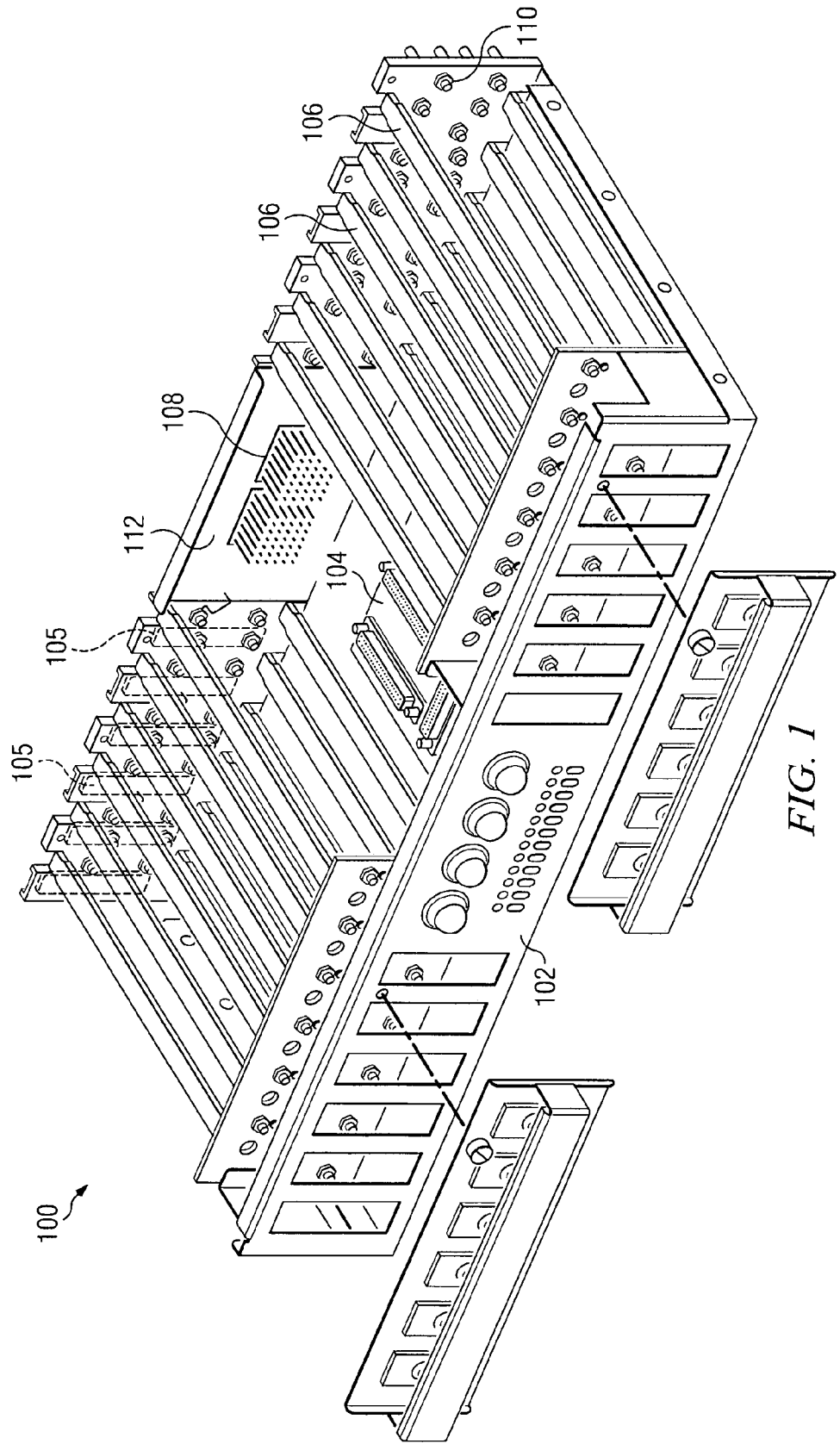
FIG. 1 illustrates a power distribution unit including a cable assembly system.

FIG. 1 illustrates an embodiment of a power distribution unit (PDU) 100. In one embodiment, PDU 100 may be used to power equipment at a telecommunications network node. PDU 100 may be configured to deliver power to the network node and to protect the node equipment from damage through a series of electrical components. In this embodiment, PDU 100 primarily includes a frame 102, a main printed circuit board 104, a plurality of bus bars (105, 106), a wire-wrap block 108, and a plurality of connectors 110 and cable assemblies (120, 130).

Frame 102 is configured as a multi-sided panel, in order to house electrical components of PDU 100. Main printed circuit board 104 (PCB 104) is generally centrally positioned within PDU 100. PCB 104 is configured to sense voltage changes within PDU 100, in addition to being configured to receive alarm input signals transmitted from external telecommunication equipment, for example external customer devices.

PDU 100 includes a plurality of bus bars 105, 106 of both positive and negative voltage potential. Each circuit within PDU 100 includes a top and bottom feeder bus bar 106 and a single return bus bar 105. Each of the feeder bus bars 106 carry a negative voltage potential (preferably −48 volts), while return bus bars 105 (shown in FIG. 3) carry a positive voltage potential. Bus bars 105, 106 of PDU 100 may be a strip of copper or aluminum used to conduct electricity. The size of the bus bars may be determinative of the maximum amount of current that may be carried on each bus bar within PDU 100. Preferably, bus bars 105, 106 may be configured to be flat strips of either copper or aluminum or some other form of conductive material capable of transmitting current and properly allowing the dissipation of heat from each bus bar within PDU 100.

Each of the plurality of feeder bus bars 106 may be covered by some form of insulation (not shown in FIG. 1). The insulation may be configured to protect each feeder bus bar 106 from accidental or inadvertent contact within PDU 100. In the present embodiment, the feeder bus bars 106 may be covered by insulation in addition to being protected by the enclosure (not shown) of PDU 100. Each of feeder bus bars 106, in FIG. 1, are secured to back panel 112 of frame 102. Back panel 112 also includes a plurality of connectors 110 in order to secure each bus bar 106 within the enclosure of PDU 100. Bus bars 105 and 106 are assembled together by assembling studs 211 (shown in FIG. 3) with connectors 110, such that studs 211 from bus bars (105, 106) pass through back panel 112, in order to couple with connectors 110 and provide connectivity within each circuit.

Back panel 112 further includes a plurality of wire-wrap pins, referred to as wire-wrap block 108. Wire-wrap block 108 may be connected to PCB 104 via cable assembly 130 (not shown). Cable assembly 130 is used to connect PCB 104 to the alarm inputs of wire-wrap block 108. Cable assembly 130 provides a connection for transmitting customer alarm inputs back to main PCB 104. Each of the individual wires of cable assembly 130 may be manually wrapped to each pin of wire-wrap block 108.

Additionally, the connection between main PCB 104 and bus bars 105, 106 may be performed by providing cable assembly 120 as a separate set of leads between PCB 104 and each bus bar 105,106. Cable assembly 120 may be used in order to sense power on each bus bar circuit, in order to determine if the bus bars are powered. In this embodiment, the cable assemblies 120 and 130 comprise a series of individual wires that are manually connected from main PCB 104 to each of the plurality of bus bars 105, 106 or to each pin of wire-wrap block 108. In some cases, manual wiring may be problematic due to the increased likelihood of mis-wiring and lack of physical space necessary to connect each of the cable assemblies to the required inputs (i.e., bus bars 105, 106 and wire-wrap block 108), in addition to the fact that the process of manually wiring bus bars 105, 106 and wire wrap block 108 to the main PCB can be time and cost intensive.

Figure 2:
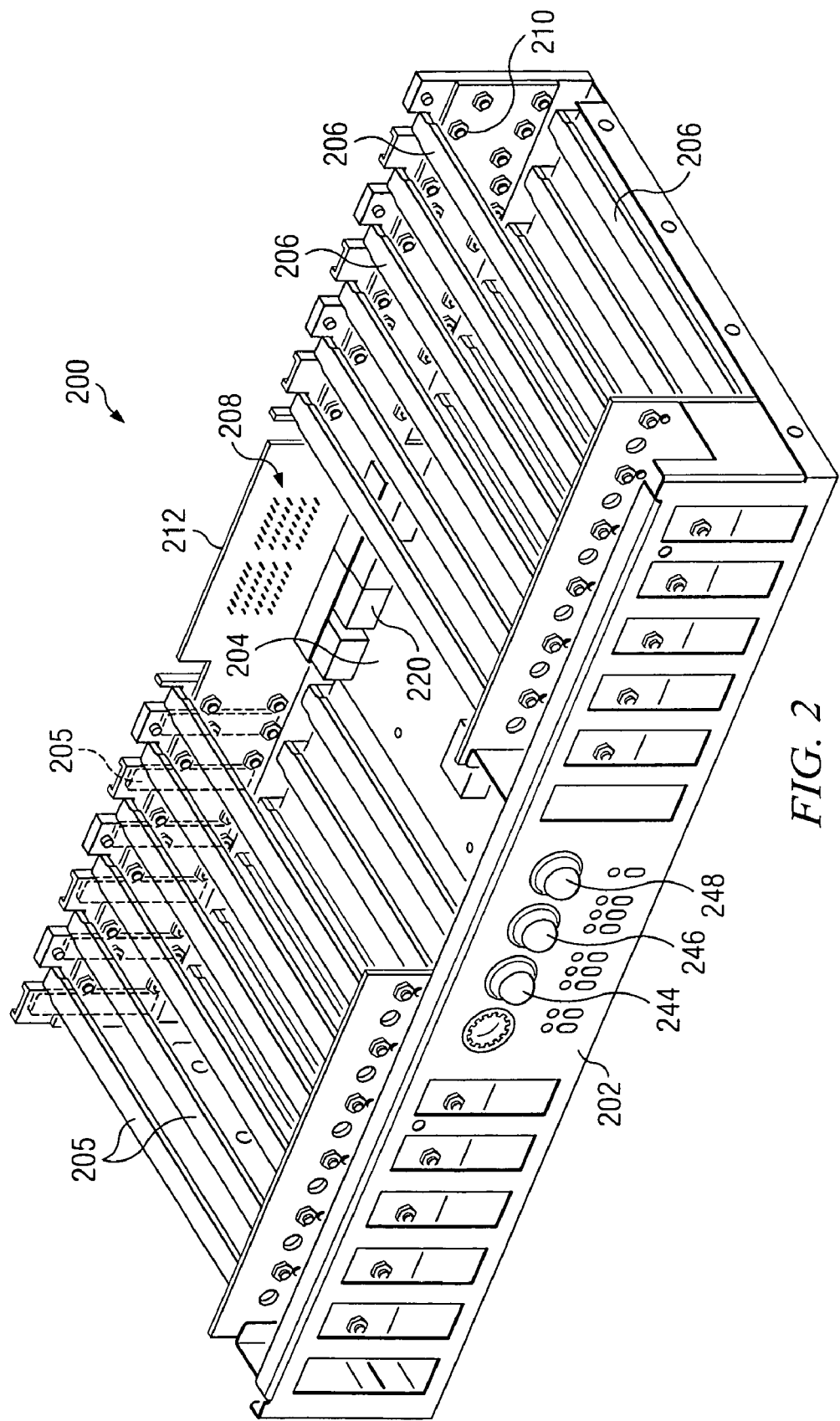
FIG. 2 illustrates a power distribution unit having a back-wiring board connecting to the main printed circuit board package according to one embodiment of the present invention.

FIG. 2 illustrates a power distribution unit (PDU) 200 having a back-wiring board (BWB) 212 connected to the main printed circuit board. In this embodiment, PDU 200 primarily includes a frame 202, a main printed circuit board 204, a plurality of bus bars 205, 206, an integrated wire-wrap block 208, and a back-wiring board 212.

Frame 202 is configured as a multi-sided panel, in order to house certain electrical components of PDU 200. Main printed circuit board (PCB) 204 is generally centrally positioned within PDU 200. PCB 204 is used to connect the various electrical components of PDU 200 using the conductive traces within the substrate of PCB 204. PCB 204 is configured to sense voltage changes within PDU 200, in addition to being configured to receive alarm input signals transmitted from external customer devices via wire-wrap block 208. In the illustrated embodiment, PDU 200 includes twelve circuits, wherein each circuit includes a top and bottom feeder bus bar 206 and a single return bus bar 205.

FIG. 2 further illustrates BWB 212 configured to include a plurality of conductive traces within its substrate, in order to provide a connection from main PCB 204 to return bus bars 205 and feeder bus bars 206, in addition to connecting to the alarm signal inputs provided by wire-wrap block 208. Return bus bars 205 and feeder bus bars 206 include a plurality of studs 211, which enable connectivity within each circuit of PDU 200. Connectors 210 are coupled to studs 211 (shown in FIG. 3) of bus bars 205, 206 and are used to secure bus bars 205, 206 within PDU 200. In particular embodiments, when bus bars 205, 206 are secured against BWB 212 using connectors 210 and studs 211, electrical connectivity is established between the bus bars 205, 206 and BWB 212 through conductive pads on the BWB 212 that contact the connectors 210.

Wire-wrap block 208 is configured to be integrated into BWB 212. The integration of wire-wrap block 208 into BWB 212 eliminates the need for wire-wrapping connections or point-to-point cable connections between the wire-wrap block and PCB 204.

BWB 212 further includes BWB connector 220, which provides a connection between the back-wiring board 212 and main PCB 204. BWB connector 220 may be a right angle connector, which provides electrical connectivity between BWB 212 and main PCB 204. Through BWB connector 220, BWB 212 is configured to transmit voltage sense signals and wire-wrap alarm inputs to PCB 204, without requiring a separate cable assembly to main PCB 204 from bus bars 205, 206 and wire-wrap block 208. The above-described, preferred embodiment eliminates the need for manual wiring between main PCB 204 and each of bus bars 205, 206 and each of the alarm signal inputs of wire-wrap block 208. In this embodiment, manual wiring is replaced by the conductor traces within the substrate of BWB 212, in order to connect main PCB 204 with return bus bars 205, feeder bus bars 206, and wire-wrap block 208.

FIG. 2 further illustrates a front panel of PDU 200. The front panel preferably includes a plurality of indicators, such as indicator lights, in order to denote that an alarm has been triggered within the power distribution unit. The indicator lights preferably include fuse 242, minor alarm 244, major alarm 246, and critical alarm 248. Fuse 242 indicates that a circuit breaker has been tripped within PDU 200. Minor alarm 244, major alarm 246, and critical alarm 248 are each triggered by the external alarm input signals received via wire-wrap pins 208 (shown in FIG. 2). For example, in one embodiment, PDU 200 may be used to power telecommunications equipment. The alarm signals of the telecommunication equipment may be connected to the wire-wrap pins 208, wherein pins 208 extend externally from PDU 200. Minor alarm 244 may be triggered to denote a minor failure within the powered equipment (e.g., a single fan failure in the telecommunications equipment). Major alarm 246 may be triggered to denote major failure within the equipment (e.g., multiple fan failures in the equipment or loss of a single power feed), which may result in a system malfunction. Critical alarm 248 may be triggered to denote a serious system failure, which may result in a complete system crash (e.g., loss of dual power feeds). Each of the indicators (242, 244, 246, 248) is configured to denote whether an external alarm has been triggered and transmitted to main PCB 204 via wire-wrap pins 208 of BWB 212.

Figure 3:
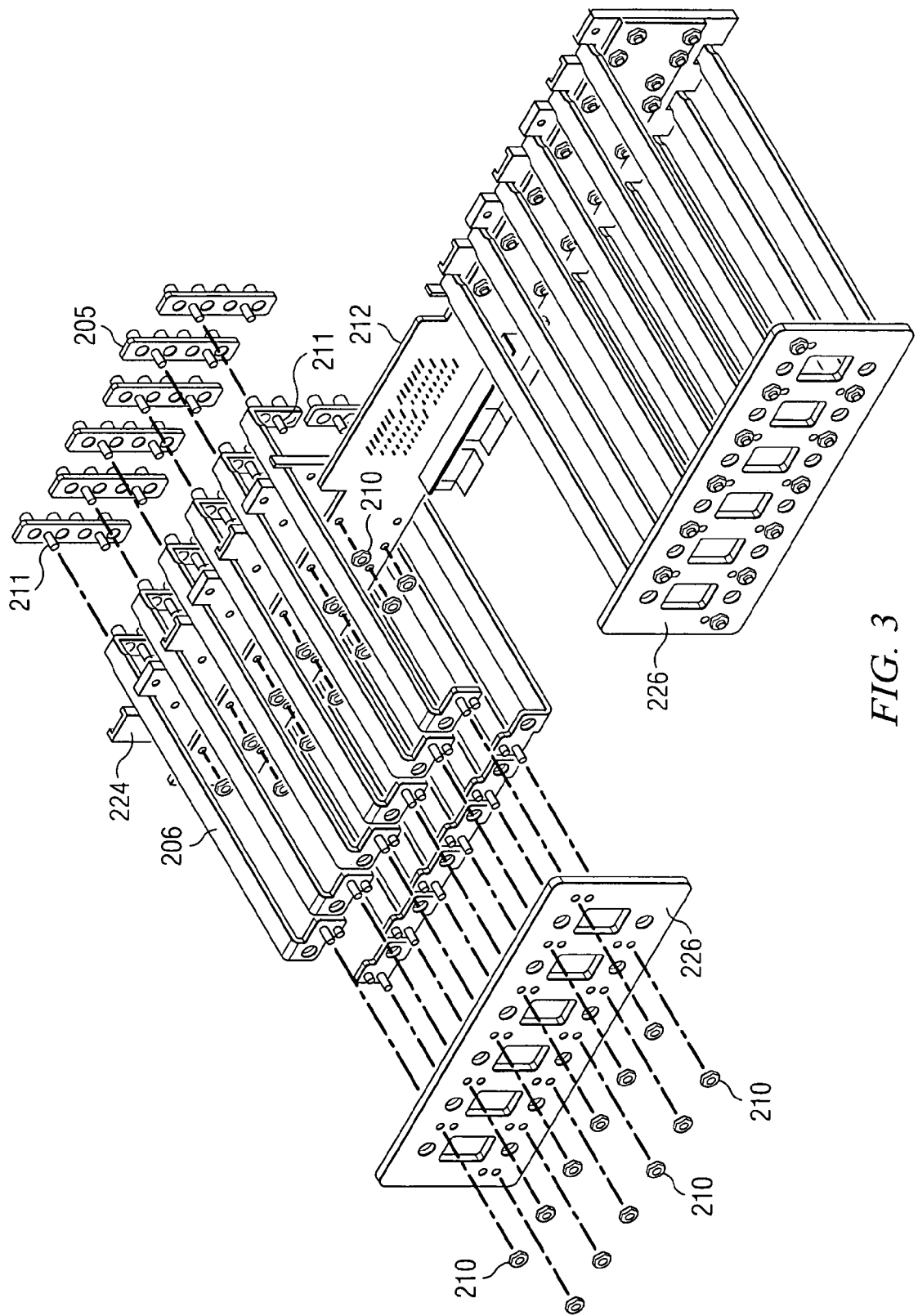
FIG. 3 illustrates an exploded view of the feeder bus bar connections within the power distribution unit.

FIG. 3 illustrates an exploded view of the feeder bus bar connections within PDU 200. FIG. 3 further exhibits the plurality of return bus bars 205 and feeder bus bars 206. Each circuit within PDU 200 includes a top and bottom feeder bus bar 206 and a single return bus bar 205. Each of the feeder bus bars 206 carry a negative voltage potential, while return bus bars 205 carry a positive voltage potential. Coupled to frame 202 is front plate panel 226 and back plate panel 224. Front plate panel 226 and back plate panel 224 are configured for securing bus bars 205 and 206 in place via connectors 210 and studs 211. The plurality of bus bars 205, 206 are preferably configured to include a plurality of studs 211. Studs 211 are configured to couple with connectors 210, in order to secure bus bars 205, 206 to front plate panel 226, back plate panel 224, and BWB 212. As noted above, when bus bars 205, 206 are secured against BWB 212 using connectors 210 and studs 211, electrical connectivity is established between the bus bars 205, 206 and BWB 212 through conductive pads on the BWB 212 that contact the connectors 210.

Figure 4:
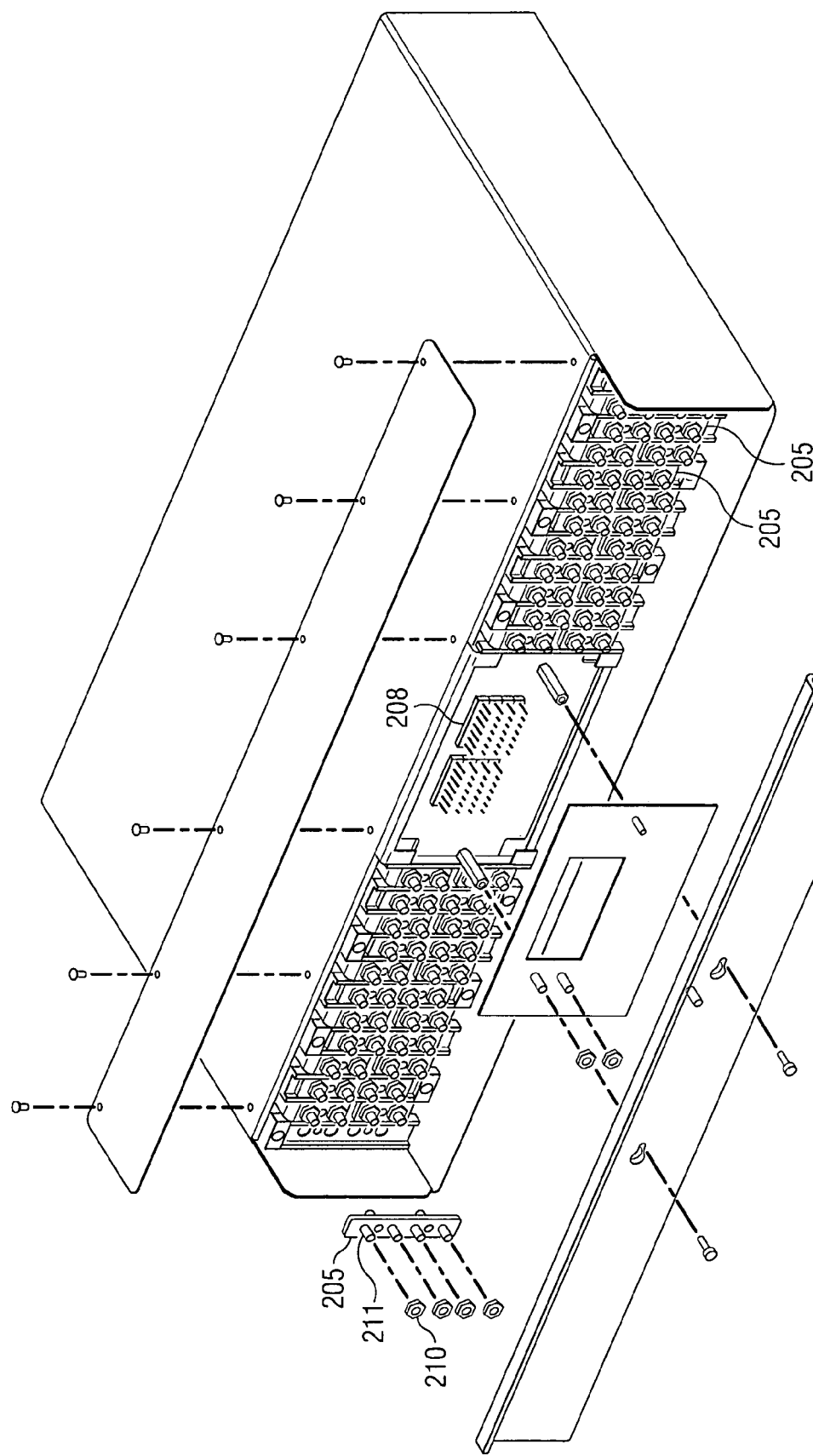
FIG. 4 illustrates a back panel view of a power distribution unit.
Figure 5:
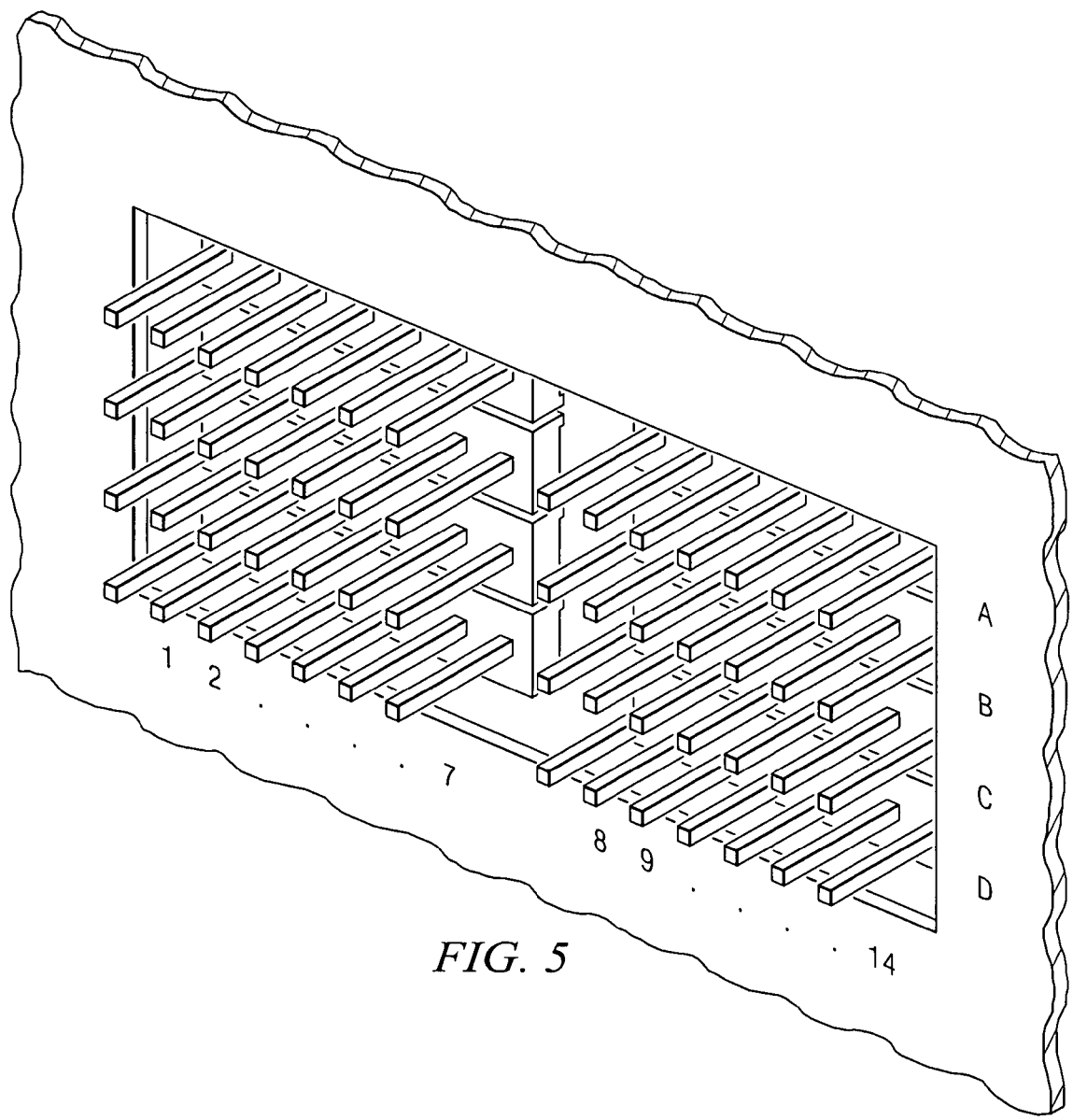
FIG. 5 illustrates a magnified view of the wire-wrap pin block.

FIG. 4 illustrates a back panel view of a power distribution unit. The back panel encloses wire wrap pins 208 and return bus bars 205, including studs 211. Wire-wrap pins 208 are configured to extend externally from PDU 200, in order to receive the externally-fed alarm input signals. FIG. 5 further illustrates the connection of bus bars 205 to PDU 200 via connectors 210 and studs 211.

FIG. 5 illustrates a magnified view of wire-wrap pin block 208. Wire-wrap pins 208 are integrated into BWB 212 in order to provide a direct connection between PCB 204 and alarm signal inputs received from external equipment (e.g., telecommunications equipment). The integrated system of wire-wrap pins 208 is configured to transmit alarm input signals to main PCB 204, without the need for separate cable assemblies to main PCB 204. Once alarm signal inputs are received at wire-wrap pins 208, the signal is transmitted through BWB 212 via BWB connector 220 (as shown in FIG. 2) thus providing an electrical connection to main PCB 204. In one embodiment, wire-wrap pin block 208 is positioned as a grid of four rows and fourteen columns embedded into the surface of BWB 212. However, the wire-wrap pin block 208 may be positioned in other configurations to accommodate the requirements of BWB 212 or the customer alarm input signals.

The herein described power distribution unit 200 is configured to eliminate the need for manual point-to-point wiring and manual wire-wrapping, in addition to further eliminating the requirement to insulate the bus bars. Such an embodiment enables voltage sense signals and wire-wrap alarm inputs to be transmitted directly to main PCB 204, without additional cable assemblies, through BWB 212.

While exemplary embodiments are illustrated in the Figures and described above, it should be understood that these embodiments are offered by way of example only. Accordingly, the present innovation is not limited to a particular embodiment, but extends to various modifications that nevertheless fall within the scope of the appended claims. The order or sequence of any processes or method steps may be varied or re-sequenced according to alternative embodiments. Describing the innovation with Figures should not be construed as imposing on the invention any limitations that may be present in the Figures.

The foregoing description of embodiments of the innovation has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principals of the innovation and its practical application to enable one skilled in the art to utilize the innovation in various embodiments and with various modifications as are suited to the particular use contemplated.

What is claimed is:

1. A power distribution unit, comprising:
   a plurality of bus bars for conducting electricity within the power distribution unit;
   a first circuit board for controlling the operation of the power distribution unit;
   a second circuit board electrically coupled to the first circuit board, wherein the second circuit board electrically couples each of the plurality of bus bars to the first circuit board such that voltage signals received by the second circuit board from each of the plurality of bus bars are transmitted to the first circuit board; and
   a plurality of wire-wrap pins integrated into a surface of the second circuit board such that data input signals received by the wire-wrap pins are transmitted to the first circuit board via the second circuit board.

2. The power distribution unit of claim 1, wherein the power distribution unit comprises a circuit breaker panel.

3. The power distribution unit of claim 1, wherein the second circuit board comprises a back wiring board.

4. The power distribution unit of claim 1, wherein a plurality of connectors mechanically secure the plurality of bus bars to the second circuit board.

5. The power distribution unit of claim 4, wherein the plurality of connectors are further configured to electrically couple the plurality of bus bars to the second circuit board.

6. The power distribution unit of claim 1, wherein the second circuit board includes a right-angle connector, the connector being configured to couple the second circuit board to the first circuit board.

7. The power distribution unit of claim 6, wherein the right-angle connector of the second circuit board is further configured to transmit the voltage signals and the data input signals to the first circuit board.

8. The power distribution unit of claim 1, wherein the data input signals transmitted via the wire-wrap pins comprise customer alarm input signals.

9. A power distribution system, comprising:
   a primary circuit board configured to control the operation of the power distribution system;
   a plurality of bus bars for conducting electricity within the power distribution system; and
   a back-wiring board electrically coupled to the primary circuit board, the back wiring board electrically coupled to the plurality of bus bars such that a voltage signal received by the back-wiring board from each of the plurality of bus bars is transmitted to the primary circuit board, the back-wiring board including a plurality of wire-wrap pins, the wire-wrap pins being integrated into a surface of the back-wiring board, wherein the wire-wrap pins are configured to receive data input signals and transmit the signals to the primary circuit board via the back-wiring board.

10. The power distribution system of claim 9, wherein the power distribution system comprises a circuit breaker panel.

11. The power distribution system of claim 9, wherein a plurality of connectors mechanically secure the plurality of bus bars to the back-wiring board.

12. The power distribution system of claim 11, wherein the plurality of connectors are further configured to electrically couple the plurality of bus bars to the back-wiring board.

13. The power distribution system of claim 9, wherein the back-wiring board includes a right-angle connector, the connector being configured to couple the back-wiring board to the primary circuit board.

14. The power distribution system of claim 13, wherein the right-angle connector is further configured to transmit the voltage signals and the data input signals to the primary circuit board via the back-wiring board.

15. The power distribution system of claim 13, wherein the right-angle connector is further configured to transmit the data input signals to the primary circuit board via the back-wiring board.

16. The power distribution system of claim 9, wherein the data input signals comprise customer alarm input signals.

* * * * *